United States Patent
Kawahara

(10) Patent No.: US 8,059,269 B2
(45) Date of Patent: Nov. 15, 2011

(54) PARTICLE INSPECTION APPARATUS, EXPOSURE APPARATUS, AND DEVICE MANUFACTURING METHOD

(75) Inventor: Atsushi Kawahara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/831,103

(22) Filed: Jul. 6, 2010

(65) Prior Publication Data

US 2010/0273115 A1    Oct. 28, 2010

Related U.S. Application Data

(63) Continuation of application No. 12/389,323, filed on Feb. 19, 2009, now Pat. No. 7,760,348.

(30) Foreign Application Priority Data

Feb. 20, 2008    (JP) ................................. 2008-039463

(51) Int. Cl.
*G01N 21/88* (2006.01)

(52) U.S. Cl. ............... 356/237.4; 356/237.1; 356/237.3; 250/559.4

(58) Field of Classification Search .... 356/237.1–237.5, 356/394–398; 250/559.4, 559.45, 559.29, 250/221, 223 R; 438/14, 16, 18
See application file for complete search history.

(56) References Cited

U.S. PATENT DOCUMENTS

| | | | | |
|---|---|---|---|---|
| 4,966,457 A | * | 10/1990 | Hayano et al. | 356/239.7 |
| 5,017,798 A | * | 5/1991 | Murakami et al. | 250/559.06 |
| 5,581,348 A | * | 12/1996 | Miura et al. | 356/237.2 |
| 5,585,916 A | * | 12/1996 | Miura et al. | 356/237.4 |
| 5,585,918 A | * | 12/1996 | Takeuchi et al. | 356/237.1 |
| 5,963,316 A | * | 10/1999 | Miura et al. | 356/237.3 |
| 6,204,917 B1 | * | 3/2001 | Smedt | 356/237.5 |
| 6,724,476 B1 | * | 4/2004 | Phan et al. | 356/237.4 |
| 7,227,628 B1 | * | 6/2007 | Sullivan et al. | 356/237.4 |
| 7,349,090 B2 | * | 3/2008 | Wack et al. | 356/369 |

* cited by examiner

*Primary Examiner* — Sang Nguyen

(74) *Attorney, Agent, or Firm* — Canon U.S.A., Inc. I.P. Division

(57) ABSTRACT

A particle inspection apparatus includes an irradiation unit configured to apply a light beam onto front and back surfaces of an object to be inspected, first and second detection units configured to detect scattering light from the surfaces, a calculation unit configured to conduct a particle inspection on the surfaces on the basis of outputs from the detection units, and a control unit configured to control the irradiation unit, the detection units, and the calculation unit. The irradiation unit can selectively apply the beam onto the front or back surface. The control unit causes the calculation unit to conduct the particle inspection on the inspection surface on which the light beam is selectively applied, on the basis of outputs made by the detection unit corresponding to simultaneous application and selective application of the light beam.

4 Claims, 7 Drawing Sheets

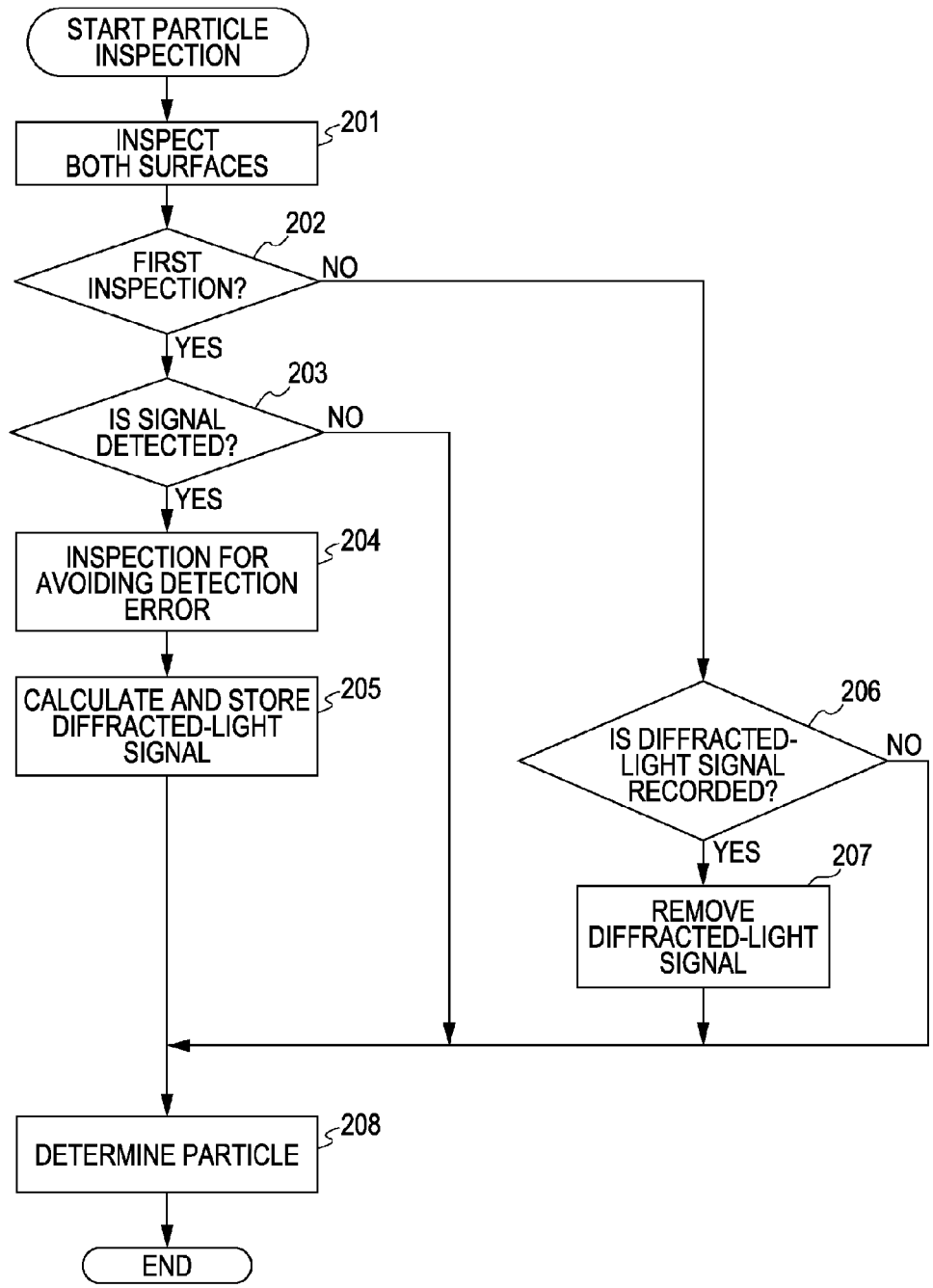

PARTICLE INSPECTION APPARATUS, EXPOSURE APPARATUS, AND DEVICE MANUFACTURING METHOD

CROSS-REFERENCE TO RELATED APPLICATIONS

This application is a continuation of U.S. patent application Ser. No. 12/389,323 filed Feb. 19, 2009, which claims priority to Japanese Application No. 2008-039463 filed Feb. 20, 2008, each of which is hereby incorporated by reference herein in its entirety.

BACKGROUND OF THE INVENTION

1. Field of the Invention

The present invention relates to a particle inspection apparatus that detects a particle adhering to an object to be inspected, for example, an original.

2. Description of the Related Art

In exposure apparatuses, a circuit pattern used to manufacture a device, for example, a semiconductor device such as an IC or an LSI, a CCD, a liquid crystal panel, or a magnetic head (hereinafter generically named a "device") is provided on an original called a reticle or a photomask.

A pellicle serving as a protective cover is attached to an original so as to prevent a particle from adhering onto the original.

In a normal IC manufacturing process, a circuit pattern provided on an original, such as a reticle or a photomask, is transferred onto a resist-coated wafer by an exposure apparatus (stepper or mask aligner).

In this case, if a particle, such as a pattern defect or dust, is present on the original, the particle is also transferred simultaneously. This lowers manufacturing yields of ICs or LSIs.

Particularly when a circuit pattern is repeatedly transferred into multiple regions on a wafer by a step-and-repeat method using a reticle, if one harmful particle is present on the reticle, the particle is transferred onto the entire wafer. As a result, the yields of ICs and LSIs are lowered significantly.

Therefore, it is essential to detect the presence of a particle on the original in the IC manufacturing process. To this end, most exposure apparatuses incorporate particle inspection apparatuses.

A particle inspection apparatus conducts a particle inspection on an inspection region preset on the original around the start of pattern transfer in the exposure apparatus.

A particle inspection apparatus of the related art incorporated in the exposure apparatus will be described with reference to FIGS. 6A and 6B serving as schematic structural views.

A detection unit 20 includes a semiconductor laser 11, a condenser lens 13, half mirrors 14 and 22, and image sensors 19a and 19b.

The detection unit 20 is driven relative to a reticle 15 by a driving unit (not shown), and can detect a particle 17 over the entire surface of the reticle 15.

Inspection light 12 emitted from the semiconductor laser 11 is shaped into parallel light by the condenser lens 13, and is divided into two inspection light beams 12a and 12b by the half mirror 14. The inspection light beam 12b is then reflected by the half mirror 22.

Further, the inspection light beams 12b is applied onto the reticle 15 serving as an object to be inspected, and a pellicle 16 serving as a protective cover for a circuit pattern 23. The pellicle 16 is held on the reticle 15 by a pellicle frame 21.

When the particle 17 is present in an irradiation region irradiated with the inspection light beam 12b, scattering light 18 is generated and is received by the image sensor 19b provided in the irradiation region, so that the particle 17 is detected.

In the exposure apparatus whose installation space is considerably restricted, the particle inspection apparatus incorporated therein often inspects both a front surface and a back surface of the reticle 15 by using the half mirrors 14 and 22 that divide the inspection light 12 into the inspection light beams 12a and 12b, as in the particle inspection apparatus shown in FIGS. 6A and 6B.

Japanese Patent Laid-Open No. 11-83752 proposes a surface-state inspection method and a surface-state inspection apparatus in which ranks of particles are reasonably set according to actual properties of the particles, and which eliminate the necessities of cleaning a reticle and of replacing a pellicle and reduces the risk of missing a particle.

Japanese Patent Laid-Open No. 8-15169 proposes a particle inspection apparatus that can precisely detect a particle, such as dust, adhering to a surface of a reticle or a pellicle, and a semiconductor-device manufacturing method using the inspection apparatus.

FIG. 7A shows a state in which a part 33 of the inspection light beam 12a entering the reticle 15 from an end of the reticle 15 is diffracted by the circuit pattern 23 and is incident as diffracted light 34 on the image sensor 19b.

FIG. 7B shows a state in which the influence of the diffracted light 34 appears in an output 25 from the image sensor 19b.

The part 33 of the inspection light beam 12a enters the reticle 15 from the end, reaches the circuit pattern 23 in a circuit pattern region 24 shown in FIG. 6, and generates the diffracted light 34 from the circuit pattern 23 on a side opposite the incident direction (a lower side of the reticle 15). When the diffracted light 34 enters the image sensor 19b, a particle scattering-light signal 26 and a pattern diffracted-light signal 27 appear in the output 25 of the image sensor 19b, and the diffracted light 34 is erroneously detected as the particle 17.

Intense diffracted light 34 that affects the particle inspection is generated by interference of the diffracted light 34 itself. For this reason, the direction in which interference light of the diffracted light 34 (hereinafter simply referred to as diffracted light) is generated is determined by, for example, the repetition pitch of the circuit pattern 23.

Hence, in the related art, the diffracted light 34 is prevented from entering the image sensor 19b by adjusting the positions of the image sensors 19a and 19b.

However, since the integration density of ICs has been increased and the circuit pattern has been diversified in recent years, it is difficult to avoid all diffracted light 34 by simply adjusting the positions of the image sensors 19a and 19b.

For this reason, the diffracted light 34 sometimes enters the image sensor 19b, and is erroneously detected as the particle 17.

When detection error is caused by the diffracted light 34, the reticle 15 is subjected to a cleaning process. This reduces the operating rate of the exposure apparatus.

While the inspection light beam 12a enters the reticle 15 from an upper end of the reticle 15 in the related art shown in FIG. 7A, the above also applies to cases in which the inspection light beam 12a enters from a front surface of the reticle 15 or a front surface of the pellicle 16.

SUMMARY OF THE INVENTION

The present invention provides a particle inspection apparatus that reduces detection error.

A particle inspection apparatus according to an aspect of the present invention includes an irradiation unit configured to apply a light beam onto front and back surfaces of an object to be inspected; a first detection unit configured to detect scattering light from the front surface; a second detection unit configured to detect scattering light from the back surface; a calculation unit configured to conduct a particle inspection on the front and back surfaces on the basis of outputs from the first detection unit and the second detection unit; and a control unit configured to control the irradiation unit, the first detection unit, the second detection unit, and the calculation unit. The irradiation unit selectively applies the light beam onto the front surface or the back surface. The control unit causes the irradiation unit to simultaneously apply the light beam onto both the front and back surfaces, causes the irradiation unit to selectively apply the light beam onto the front surface or the back surface, and causes the calculation unit to conduct the particle inspection on the inspection surface on which the light beam is selectively applied, on the basis of outputs made by the detection unit corresponding to simultaneous application and selective application of the light beam.

Further features of the present invention will become apparent from the following description of exemplary embodiments with reference to the attached drawings.

BRIEF DESCRIPTION OF THE DRAWINGS

FIG. 5 is a flowchart showing another procedure formed in the embodiment.

DESCRIPTION OF THE EMBODIMENTS

Figure 1:
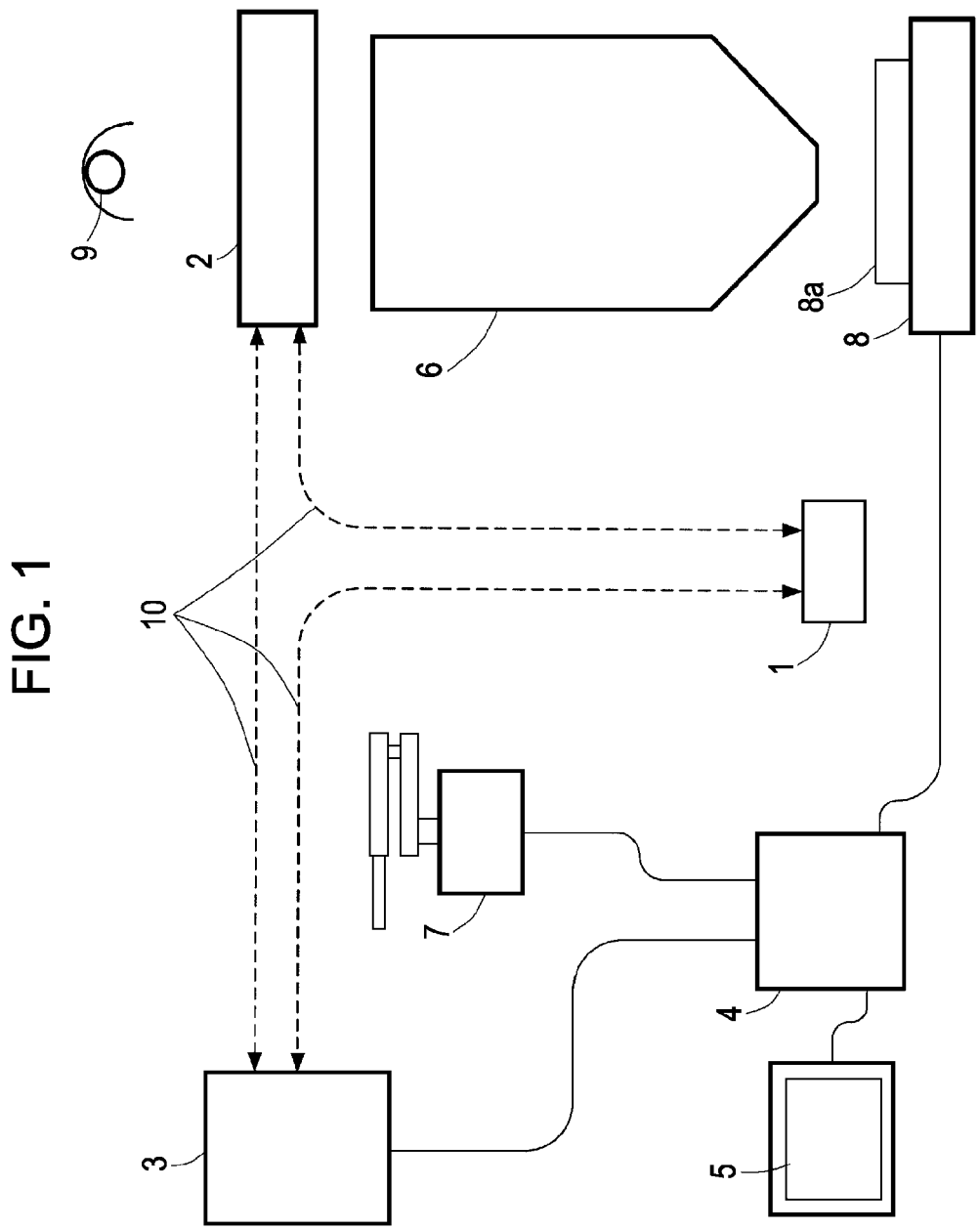
FIG. 1 shows an overall configuration of an exposure apparatus according to an embodiment of the present invention.

A semiconductor exposure apparatus including a particle inspection apparatus according to an embodiment of the present invention will be described with reference to FIG. 1.

The semiconductor exposure apparatus according to this embodiment repeatedly transfers a circuit pattern in multiple shot regions on a wafer by a step-and-repeat method using an exposure original, such as a reticle or a photomask, which is used in the semiconductor field.

A reticle serving as an original is first placed at a reticle insertion port 1. A reticle stage 2 is a mechanism for holding the reticle above a projection lens 6.

A particle inspection apparatus 3 according to this embodiment makes an inspection for adhesion of a particle to the reticle. A control device 4 controls a conveying robot, which will be described below, gives the particle inspection apparatus 3 instructions to convey the reticle and to conduct a particle inspection, and controls exposure.

A console 5 allows setting various exposure parameters for the control device 4, and displays the operating condition of the exposure apparatus.

The projection lens 6 forms a pattern image obtained from a circuit pattern on the reticle onto a wafer 8a serving as a substrate.

A conveying robot 7 conveys the reticle to the sections in the exposure apparatus according to the instructions from the control device 4.

A wafer stage 8 holds the wafer 8a serving as the substrate below the projection lens 6.

A light source lamp 9 illuminates the pattern on the reticle so as to form a pattern image. The reticle is conveyed along conveying paths 10 in the exposure apparatus.

The particle inspection apparatus 3 according to the embodiment will now be described with reference to FIGS. 1, 2, and 3.

Figure 2A:
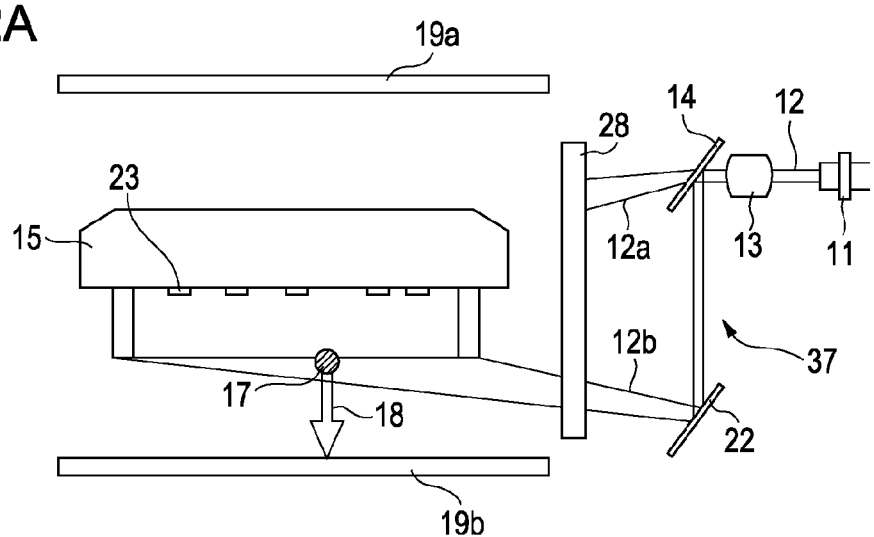
FIG. 2A shows a configuration of a particle inspection apparatus according to the embodiment of the present invention.
Figure 2B:
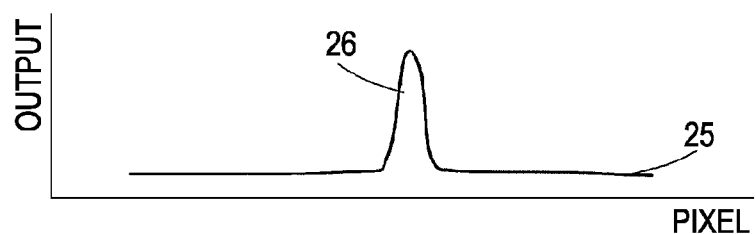
FIG. 2B shows an output from an image sensor.

FIG. 2A shows a state in which a particle inspection is conducted on a lower surface of a reticle 15 in a condition where a light-shielding selection unit 28 provided in optical paths of inspection light beams 12a and 12b blocks the inspection light beam 12a incident on an upper surface of the reticle 15 to be inspected so that pattern diffracted light is not generated on the lower surface of the reticle 15. An irradiation unit 37 including a semiconductor laser 11, a condenser lens 13, and half mirrors 14 and 22 respectively applies the inspection light beams 12a and 12b onto the upper (front) and lower (back) surfaces of the reticle 15 to be inspected.

The irradiation unit 37 also includes the light-shielding selection unit 28 that selectively applies the inspection light beam 12a or 12b onto the front or back surface of the reticle 15.

An image sensor 19a serving as a first detection unit detects scattering light from the front surface of the reticle 15.

An image sensor 19b serving as a second detection unit detects scattering light from the back surface of the reticle 15.

Figure 3A:
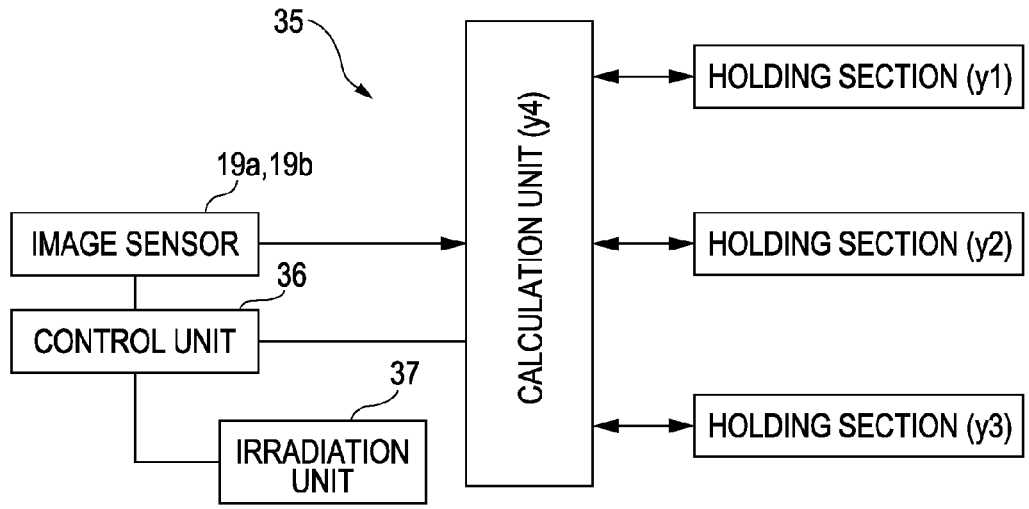
FIG. 3A shows a configuration of a part of the particle inspection apparatus according to the embodiment.

A calculation unit 35 shown in FIG. 3A inspects the front and back surfaces of the reticle 15 for a particle 17 on the basis of the outputs from the image sensor 19a serving as the first detecting unit and the image sensor 19b serving as the second detecting unit.

A control unit 36 controls the irradiation unit 37, the image sensor 19a, the image sensor 19b, and the calculation unit 35.

The light-shielding selection unit 28 will now be described with reference to FIGS. 2 and 3.

The light-shielding selection unit 28 is provided in the optical paths of the inspection light beams 12a and 12b, and is controlled by the control unit 36 according to instructions from the operator or instructions determined on the basis of the previous inspection result.

Under the control of the control unit 36, the light-shielding selection unit 28 selects one or both of the front and back surfaces of the reticle 15 as an object on which the inspection light beam 12a or 12b is incident.

The control unit 36 causes the irradiation unit 37 to simultaneously apply the inspection light beams 12a and 12b onto the front and back surfaces of the reticle 15, and to selectively apply one of the inspection light beams 12a and 12b onto the front or back surface.

Further, the control unit 36 causes the calculation unit 35 to make an inspection for a particle 17 in conjunction with at least one of the image sensors 19a and 19b corresponding to the surface of the reticle 15 to which the inspection light beam 12a or 12b is selectively applied.

More specifically, the control unit 36 causes the calculation unit 35 to conduct the particle inspection on the basis of the output corresponding to simultaneous application of the inspection light beams 12a and 12b and the output corresponding to selective application of the inspection light beam 12a or 12b.

In the light-shielding selection unit 28, a light-shielding plate 32 is held by a light-shielding-plate holding member 29 that also functions as a pulley.

The light-shielding-plate holding member 29 is connected to a motor 30 via a belt 31, and rotates the motor 30 so as to rotate the entire light-shielding-plate holding member 29.

The inspection light beam 12a incident on the front (upper) surface of the reticle 15 is blocked so as not to enter the reticle 15.

Figure 2C:
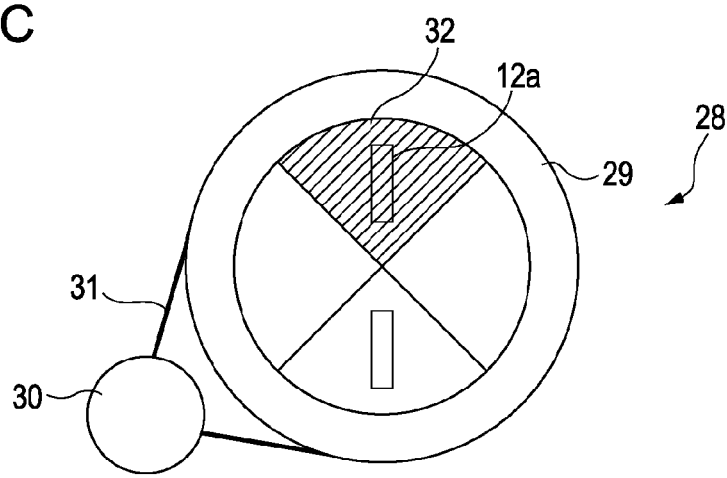
FIG. 2C shows a light-shielding selection unit.

In order to block the inspection light beam 12b incident on the back (lower) surface of the reticle 15, the light-shielding-plate holding member 29 is rotated 180 degrees from a state shown in FIG. 2C.

Figure 7A:
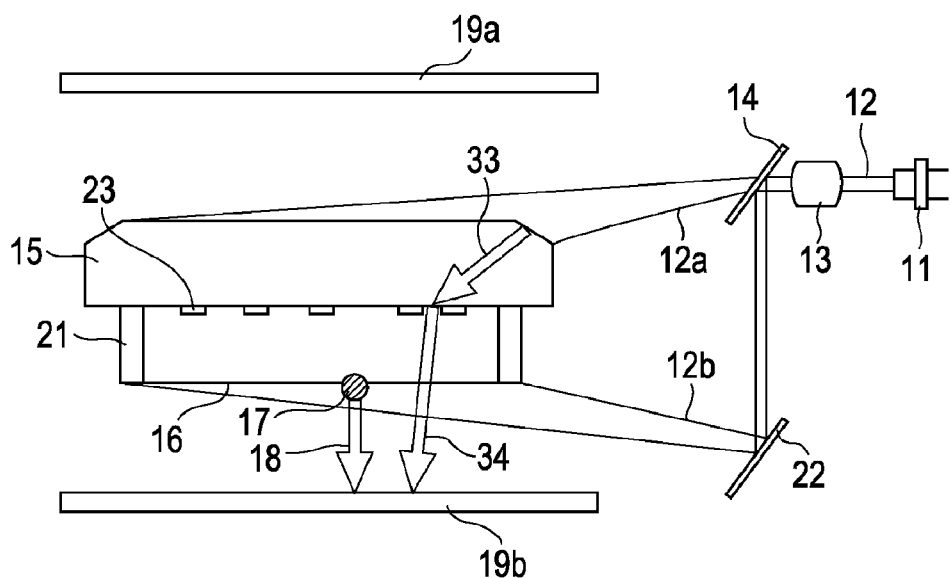
FIGS. 7A and 7B explain the principle of generation of pattern diffracted light in the related art.
Figure 7B:
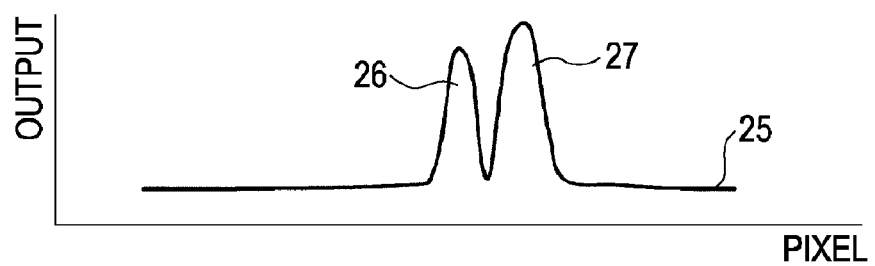

The light-shielding selection unit 28 blocks the inspection light beam 12a or 12b incident on the opposite surface, which causes the diffracted light 34 shown in FIG. 7, as needed. This allows an inspection for the particle 17 to be performed without any influence of the diffracted light 34 generated by the circuit pattern 23.

While the inspection light beam 12a incident on the front (upper) surface of the reticle 15 or the inspection light beam 12b incident on the back (lower) surface of the reticle 15 is selectively blocked by the light-shielding selection unit 28 in this embodiment, for example, the following configuration can be adopted.

That is, a semiconductor laser serving as a light source and an optical system for applying the inspection light beam 12a onto the upper surface of the reticle 15 can be provided separately from a semiconductor laser serving as a light source and an optical system for applying the inspection light beam 12b onto the lower surface of the reticle 15, and the two light sources can be selectively operated to emit light.

The calculation unit 35 that constitutes the particle inspection apparatus 3 according to the embodiment will now be described with reference to FIGS. 3A and 3B.

A holding section y1 holds a particle scattering-light signal 26 and a pattern diffracted-light signal 27 output from the image sensor 19a or 19b that is not shielded from the inspection light beam 12a or 12b.

A holding section y2 holds a particle scattering-light signal 26 output from the image sensor 19a or 19b from which the influence of diffracted light is removed by blocking the inspection light beam 12a or 12b.

A holding section y3 holds a pattern diffracted-light signal 27.

A calculation section y4 calculates a difference between the particle scattering-light signal 26 and the pattern diffracted-light signal 27, and sets the difference in an arbitrary holding section.

With the above-described components, the calculation unit 35 mainly performs the following procedure.

The calculation unit 35 calculates a pattern diffracted-light signal 27 from signals held in the holding sections y1 and y2, and sets the pattern diffracted-light signal 27 in the holding section y3.

Alternatively, the calculation unit 35 calculates a particle scattering-light signal 26 serving as a signal output from the image sensor 19a or 19b that is not affected by diffracted light, from signals held in the holding sections y1 and y3, and sets the particle scattering-light signal 26 in the holding section y2.

Figure 3B:
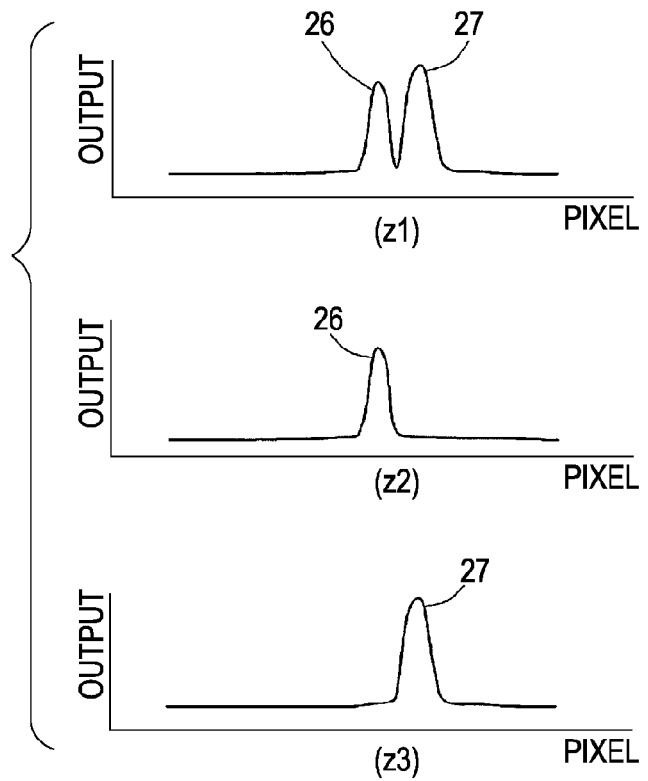
FIG. 3B shows examples of signals held in holding sections.

FIG. 3B shows examples of signals held in the holding sections y1 to y3.

A signal z1 includes a particle scattering-light signal 26 and a pattern diffracted-light signal 27 held in the holding section y1. These signals are output from the image sensor 19a or 19b that is not shielded from the inspection light beam 12a or 12b.

A signal z2 includes a particle scattering-light signal 26 held in the holding section y2. The signal is output from the image sensor 19a or 19b that is not affected by diffracted light.

A signal z3 includes a pattern diffracted-light signal 27 held in the holding section y3.

The calculation unit 35 can calculate a pattern diffracted-light signal 27 from signals output when light shielding is performed and when light shielding is not performed.

The calculated pattern diffracted-light signal 27 is stored in the apparatus. In second and subsequent particle inspections conducted on the same reticle 15, the pattern diffracted-light signal 27 can be removed by calculation from a signal output during a double-sided inspection.

Figure 4:
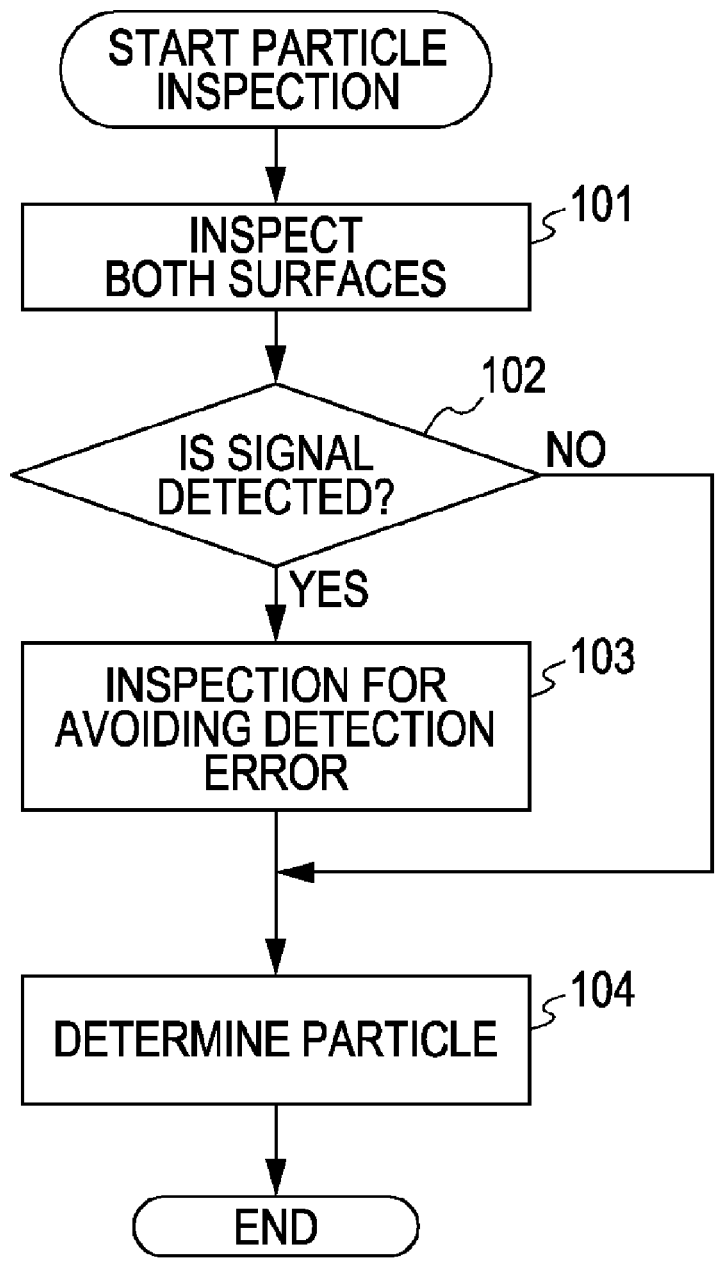
FIG. 4 is a flowchart showing a procedure performed in the embodiment.
Figure 6A:
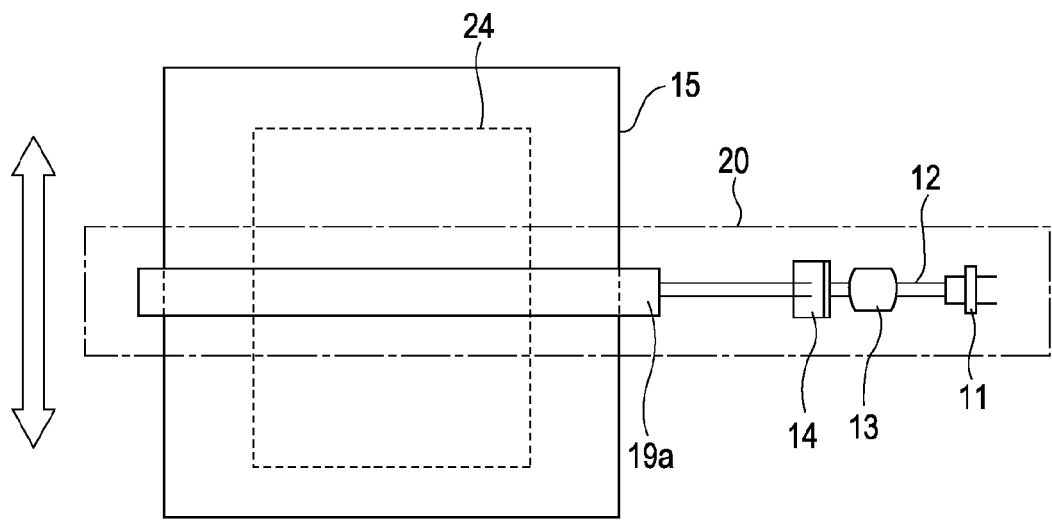
FIGS. 6A and 6B schematically show a configuration of a particle inspection apparatus of the related art.
Figure 6B:
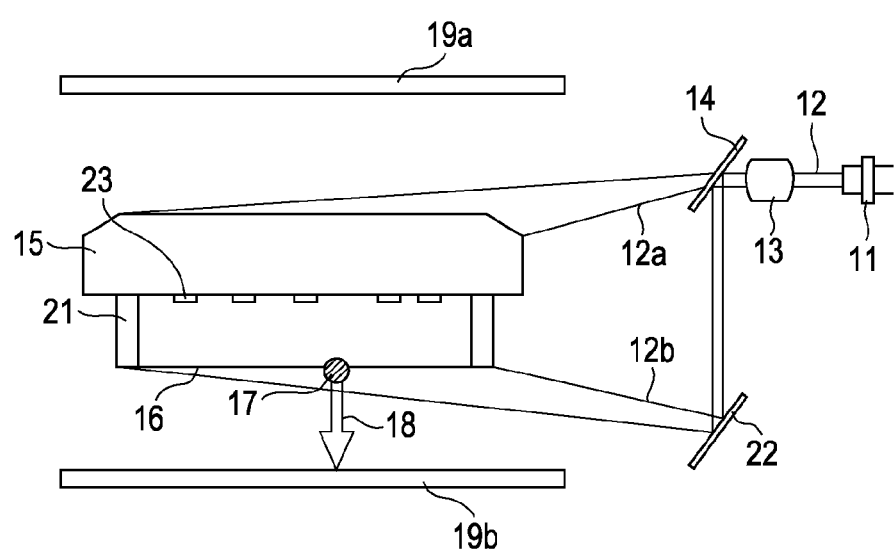

Another particle inspection method using the particle inspection apparatus 3 according to this embodiment will now be described with reference to FIG. 4.

In this particle inspection method, both surfaces of the reticle 15 are simultaneously inspected without blocking the inspection light beams 12a and 12b.

When the level of the output from at least one of the image sensor 19a and 19b obtained by simultaneous application of the inspection light beams 12a and 12b exceeds a threshold value, the control unit 36 causes the irradiation unit 37 to selectively apply the inspection light beam 12a or 12b.

When the output level does not exceed the threshold value, the control unit 36 does not cause the irradiation unit 37 to selectively apply the inspection light beam 12a or 12b.

In this case, the calculation unit 35 is caused to conduct an inspection for the particle 17 on the basis of the outputs from the image sensors 19a and 19b corresponding to simultaneous application of the inspection light beams 12a and 12b.

In Step S101, both the front and back surfaces of the reticle 15 are simultaneously inspected for a particle by driving the irradiation unit 37 and the image sensors 19a and 19b relative to the reticle 15 in a state in which the inspection light beams 12a and 12b are respectively incident on the front and back surfaces of the reticle 15.

In Step S102, it is determined whether or not the levels of the signals output in an inspection region from the image sensors 19a and 19b corresponding to both surfaces of the reticle 15 exceed a particle detection level set beforehand in the particle inspection apparatus 3 of this embodiment.

When the levels of the output signals for both surfaces are less than or equal to the particle detection level, the particle inspection is finished.

In Step S103, a particle inspection is conducted on each surface where the output signal exceeds the detection level, while blocking the inspection light beam incident on the opposite surface.

This inspection can be performed without any influence of diffracted light.

In Step S104, the position and size of the particle are calculated and output by using the output obtained in step S103 without any influence of diffracted light.

According to this particle inspection method, a detection-error avoiding inspection for avoiding detection error is automatically performed only when required, regardless of the operator's awareness. Therefore, the operating rate of the exposure apparatus can be maximized.

A further particle inspection method using the particle inspection apparatus 3 of the embodiment will now be described with reference to FIG. 5.

In this inspection method, a signal component corresponding to pattern diffracted light is calculated from the difference between signals output from the image sensor in a double-sided inspection and a detection-error avoiding inspection. The signal component is stored in the apparatus.

During second and subsequent inspections of the same reticle 15, the signal component of the pattern diffracted light is removed by calculation from an output signal in the double-sided inspection, thereby removing the influence of the pattern diffracted light without conducting a detection-error avoiding inspection.

In other words, a detection-error avoiding inspection is conducted on only one surface in a state in which the inspection light beam 12a or 12b incident on the opposite surface is blocked to avoid pattern diffracted light. The detection-error avoiding inspection is automatically performed after a double-sided inspection, only when required.

The calculation unit 35 calculates the difference between the output corresponding to simultaneous application of the inspection light beams 12a and 12b and the output corresponding to selective application of the inspection light beam 12a or 12b, and stores the difference. Further, the calculation unit 35 inhibits the irradiation unit 37 from selectively applying the inspection light beam 12a or 12b in subsequent inspections of the object.

In this case, the irradiation unit 37 is caused to simultaneously apply the inspection light beams 12a and 12b, and the above-described difference is subtracted from at least one of the outputs corresponding to the simultaneously applied inspection light beams 12a and 12b, and an inspection for the particle 17 is performed.

In Step S201, the detection unit is driven relative to the reticle 15 in a state in which the inspection light beams 12a and 12b are respectively incident on the front and back surfaces of the reticle 15, so that both surfaces of the reticle 15 are simultaneously inspected for a particle.

In Step S202, when the reticle 15 has previously been inspected by the particle inspection apparatus 3 of the embodiment, the procedure proceeds to Step S206.

In Step S203, it is determined whether or not the levels of signals output from the image sensors 19a and 19b in the inspection region corresponding to both surfaces of the reticle 15 exceed a particle detection level set beforehand in the particle inspection apparatus 3.

When the output signals from both image sensors 19a and 19b are less than or equal to the particle detection level, the particle inspection is finished.

In Step S204, a particle inspection is conducted on each surface where the output signal from the image sensor 19a or 19b exceeds the detection level, while blocking the inspection light beam incident on the opposite surface.

This inspection can be performed without any influence of diffracted light.

In Step S205, a diffracted-light signal is calculated from the outputs from the image sensor in the double-sided inspection and the detection-error avoiding inspection, and is held in the calculation unit 35 so as to be removed by calculation in subsequent inspections.

In Step S206, when a diffracted-light signal is not held in the previous inspection, since diffracted light that affects the particle inspection is not generated, the procedure proceeds to Step S208.

In Step S207, the diffracted-light signal held in the previous inspection is removed by calculation from the signal output in the double-sided inspection.

In Step S208, the position and size of the particle 17 are calculated and output on the basis of the inspection result in Step S201 or 204 or the calculation result in Step S207.

According to this particle inspection method, the detection-error avoiding inspection is unnecessary in second and subsequent particle inspections of the same reticle 15. This can minimize the inspection time.

Device Manufacturing Method

A device (e.g., a semiconductor integrated circuit element or a liquid crystal display element) is manufactured with the exposure apparatus according to any of the above-described embodiments through a step of exposing a substrate (e.g., a wafer or a glass plate) coated with a photosensitive material, a step of developing the substrate, and other known steps.

According to the embodiments of the present invention, for example, detection error of the particle inspection apparatus can be reduced.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

What is claimed is:

1. A particle inspection apparatus comprising:
an irradiation unit configured to apply a light beam onto each of front and back surfaces of an object to be inspected, the object including a transparent member;
a first detection unit configured to detect scattering light from the front surface;
a second detection unit configured to detect scattering light from the back surface;
a calculation unit configured to conduct a particle inspection on the front and back surfaces on the basis of outputs from the first detection unit and the second detection unit; and
a control unit configured to control the irradiation unit, the first detection unit, the second detection unit, and the calculation unit,
wherein the irradiation unit includes a light-shielding selection unit configured to selectively block the light beam applied to the front surface or the light beam applied to the back surface, and
wherein the control unit causes the light-shielding selection unit to simultaneously apply the light beam onto the front and back surfaces, determines whether the light beam should be selectively applied onto the front surface or the back surface based on outputs made by the first detection unit and the second detection unit corresponding to simultaneous application of the light beam, causes the light-shielding selection unit to selectively apply the light beam onto the front surface or the back surface when it is determined that the light beam should be selectively applied, and causes the calculation unit to conduct the particle inspection based on outputs made by the detection unit corresponding to selective application of the light beam.

2. An exposure apparatus that exposes a substrate via an original, the apparatus comprising:
the particle inspection apparatus according to claim 1, the transparent member is the original.

3. The exposure apparatus according to claim 2, wherein the object includes a pellicle.

4. A device manufacturing method comprising the steps of:
exposing a substrate with the exposure apparatus according to claim 2; and
developing the exposed substrate.

* * * * *